United States Patent
Liang et al.

(10) Patent No.: US 9,041,183 B2
(45) Date of Patent: May 26, 2015

(54) POWER MODULE PACKAGING WITH DOUBLE SIDED PLANAR INTERCONNECTION AND HEAT EXCHANGERS

(75) Inventors: Zhenxian Liang, Knoxville, TN (US); Laura D. Marlino, Oak Ridge, TN (US); Puqi Ning, Knoxville, TN (US); Fei Wang, Knoxville, TN (US)

(73) Assignees: UT-BATTELLE, LLC, Oak Ridge, TN (US); UNIVERSITY OF TENNESSEE RESEARCH FOUNDATION, Knoxville, TN (US)

( * ) Notice: Subject to any disclaimer, the term of this patent is extended or adjusted under 35 U.S.C. 154(b) by 313 days.

(21) Appl. No.: 13/547,937

(22) Filed: Jul. 12, 2012

(65) Prior Publication Data

US 2013/0020694 A1  Jan. 24, 2013

Related U.S. Application Data

(60) Provisional application No. 61/509,312, filed on Jul. 19, 2011.

(51) Int. Cl.
| | | |
|---|---|---|
| *H01L 23/52* | (2006.01) | |
| *H01L 23/34* | (2006.01) | |
| *H01L 23/473* | (2006.01) | |
| *H01L 23/373* | (2006.01) | |
| *H01L 25/07* | (2006.01) | |
| *H01L 25/18* | (2006.01) | |
| *H01L 23/00* | (2006.01) | |

(52) U.S. Cl.
CPC .......... *H01L 23/473* (2013.01); *H01L 23/3735* (2013.01); *H01L 2224/8384* (2013.01); *H01L2924/13091* (2013.01); *H01L 2924/13055* (2013.01); *H01L 25/072* (2013.01); *H01L 25/18* (2013.01); *H01L 2224/291* (2013.01); *H01L 2224/29339* (2013.01); *H01L 2224/83825* (2013.01); *H01L 2224/8383* (2013.01); *H01L 24/29* (2013.01); *H01L 24/32* (2013.01); *H01L 24/33* (2013.01); *H01L 24/83* (2013.01); *H01L 2224/32225* (2013.01); *H01L 2924/1306* (2013.01); *H01L 2924/1305* (2013.01)

(58) Field of Classification Search
CPC ................. H01L 2924/13055; H01L 2924/00; H01L 2924/00014; H01L 2924/014; H01L 2224/8384; H01L 2224/8084; H01L 2224/8184; H01L 2224/8284; H01L 2224/8484; H01L 2224/8584; H01L 2224/8684; H01L 2224/80801; H01L 2224/81801; H01L 2224/82801; H01L 2224/83801; H01L 2224/84801; H01L 2224/85801; H01L 2224/86801; H01L 2224/80894; H01L 2224/81894; H01L 2224/82895; H01L 2224/83894; H01L 2224/84895; H01L 2224/8583; H01L 2224/85895; H01L 2224/86895; H01L 23/3735; H01L 23/34; H01L 25/072; H01L 25/18; H01L 21/187; H01L 29/7302; H01L 29/66295; H01L 27/0255; H01L 27/0647; H01L 27/075; H01L 27/1021; H01L 2225/755; H01L 2225/765; H01L 2225/775; H01L 2225/785; H01L 2225/795; H01L 2225/1094; H01L 2225/06589
USPC ................. 257/686, 691, 706, 712, 713, 714, 257/E27.019, E27.037, E23.106
See application file for complete search history.

(56) References Cited

U.S. PATENT DOCUMENTS

| | | | |
|---|---|---|---|
| 7,015,578 B2 | 3/2006 | Nakamura et al. ............ | 257/713 |
| 7,612,447 B2 | 11/2009 | Ward et al. .................... | 257/712 |
| 7,751,194 B2 | 7/2010 | Sakamoto et al. ............ | 361/719 |
| 2006/0138452 A1* | 6/2006 | Knapp et al. .................. | 257/177 |
| 2008/0054425 A1* | 3/2008 | Malhan et al. ................ | 257/678 |
| 2008/0158924 A1* | 7/2008 | Rinehart et al. .............. | 363/123 |
| 2009/0219696 A1* | 9/2009 | Nakayama et al. ........... | 361/709 |
| 2009/0283919 A1* | 11/2009 | Tsui et al. ..................... | 257/778 |
| 2009/0302444 A1* | 12/2009 | Ueda et al. .................... | 257/675 |
| 2010/0175857 A1 | 7/2010 | Gerstler et al. .......... | 165/104.31 |

| | | | | |
|---|---|---|---|---|
| 2010/0302737 | A1* | 12/2010 | Yankoski et al. | 361/709 |
| 2013/0015495 | A1* | 1/2013 | Hauenstein | 257/140 |
| 2013/0050947 | A1* | 2/2013 | Kadoguchi et al. | 361/715 |
| 2014/0091452 | A1* | 4/2014 | Katou et al. | 257/706 |
| 2014/0104790 | A1* | 4/2014 | Yoon et al. | 361/716 |

FOREIGN PATENT DOCUMENTS

| | | | | |
|---|---|---|---|---|
| CN | 201508835 U | 6/2010 | | H01L 25/07 |
| JP | 2004111431 A | 4/2004 | | H01L 25/07 |
| WO | WO 2009/101685 A1 | 8/2009 | | H01L 23/12 |

OTHER PUBLICATIONS

Ahmed, Sayeed, "*Putting the Electrical Power in Hybrid Powertrains*," Auto Electronics (2007) pp. 22-25.

Nozawa, Natsuki et al., "*Development of Power Control Unit for Compact-Class Vehicle*," SAE International, Paper No. 2009-01-1310, (2009) pp. 376-382.

Rong, Hsueh-Chang, "*300A 650V 70 um Thin IGBTs with Double-Sided Cooling*," Power Semiconductor Devices & IC's (ISPSD) (2011) pp. 320-323.

Sato, Yoshinori et al., "*Development of High Response Motor and Inverter System for the Nissan LEAF Electric Vehicle*," SAE International, Paper No. 2011-01-0350, (2011) pp. 8.

Stockmeier, Thomas, "*SKiN: Double Side Sintering Technology for New Packages*," Power Semiconductor Devices & IC's (ISPSD) (2011) pp. 324-327.

Ueda, Tetsuya et al., "*Simple, Compact, Robust and High Performance Power Module T-PM (Transfer-molded Power Module)*," Power Semiconductor Devices & IC's (ISPSD) (2010) pp. 47-50.

* cited by examiner

*Primary Examiner* — Teresa M Arroyo
(74) *Attorney, Agent, or Firm* — Brinks Gilson & Lione

(57) ABSTRACT

A double sided cooled power module package having a single phase leg topology includes two IGBT and two diode semiconductor dies. Each IGBT die is spaced apart from a diode semiconductor die, forming a switch unit. Two switch units are placed in a planar face-up and face-down configuration. A pair of DBC or other insulated metallic substrates is affixed to each side of the planar phase leg semiconductor dies to form a sandwich structure. Attachment layers are disposed on outer surfaces of the substrates and two heat exchangers are affixed to the substrates by rigid bond layers. The heat exchangers, made of copper or aluminum, have passages for carrying coolant. The power package is manufactured in a two-step assembly and heating process where direct bonds are formed for all bond layers by soldering, sintering, solid diffusion bonding or transient liquid diffusion bonding, with a specially designed jig and fixture.

10 Claims, 7 Drawing Sheets

POWER MODULE PACKAGING WITH DOUBLE SIDED PLANAR INTERCONNECTION AND HEAT EXCHANGERS

CROSS REFERENCE TO RELATED APPLICATION

This application makes reference to and claims priority to U.S. Provisional Application No. 61/509,312, filed Jul. 19, 2011, which is incorporated herein by reference in its entirety.

STATEMENT REGARDING FEDERALLY FUNDED RESEARCH AND DEVELOPMENT

This invention was made with government support under Contract No. DE-AC05-00OR22725 between UT-Battelle, LLC. and the U.S. Department of Energy. The government has certain rights in the invention.

BACKGROUND OF THE INVENTION

1. Technical Field

This invention relates to power module packaging systems, and more particularly, to systems with planar bonded interconnections and double sided cooling.

2. Related Art

The requirements of power electronics systems in hybrid electric vehicles (HEVs) and in all electric vehicles (EVs) call for significant improvements in cost, reliability, functionality, power density and efficiency. Among these systems are power modules which include power semiconductor devices, and packaging components. The power semiconductor devices, such as insulated gate bipolar transistors (IGBTs), metal-oxide semiconductor field-effect transistors (MOSFETs), and diodes may comprise slices made of Si, SiC, or GaN, etc., which may be referred to as dies or semiconductor dies. These dies may be arranged within the modules to provide electrical functions in the form of inverter and converter topologies, for example. Module packaging serves to provide electrical interconnections, thermal management and mechanical support to the multiple semiconductor dies. The packaging components may utilize wire bonding as interconnections within and among the power semiconductor switches.

The criteria used to evaluate a power module may include electrical, thermal, thermo-mechanical and mechanical performance parameters of power semiconductors and packaging components, for example, thermal impedance, operational temperature (thermal performance), electrical parasitic resistance, inductance (electrical performance), power cycling, thermal cycling/shock, vibration ruggedness, etc. (reliability), as well as manufacturability (cost).

SUMMARY

A power module package may be comprised of a pair of semiconductor dies made up of an insulated gate bipolar transistor (IGBT) semiconductor die and a diode semiconductor die spaced apart from the IGBT semiconductor die. The first device pair forms a planar power switch unit. The power module package also may be comprised of a second pair of devices composed of a second IGBT semiconductor die and a second diode semiconductor die spaced apart from the second IGBT semiconductor die. The second IGBT semiconductor die and the second diode semiconductor die may form a second planar power switch unit. The first planar power switch unit and the second planar power switch unit may be connected and arranged to form a planar, one phase leg configuration. The first planar power switch unit may be oriented in a face-up configuration relative to the plane of the one phase leg configuration and the second planar power switch unit may be oriented in a face-down configuration relative to the plane. A first of a pair of direct bonded copper (DBC) substrates may be directly bonded to a top side of the planar one phase leg configuration and a second of the pair of DBC substrates may be directly bonded to a bottom side of the planar one phase leg configuration to form a sandwich structure. A patterned inner surface of each of the pair of DBC substrates may be attached and aligned with semiconductor die pads of the first planar power switch unit and the second planar power switch unit. A substrate attachment layer may be applied on the outer surface of each of the pair of DBC substrates where the outer surfaces are opposite the patterned inner surfaces of each of the pair of DBC substrates. Each of the two heat exchangers may be directly bonded to the outer surface of each of the pair of DBC substrates by each of the substrate attachment layers.

Several examples of a planar bonded and double sided cooled power module are disclosed. A double sided cooled power module may have IGBTs; diodes spaced apart from the IGBTs; a pair of DBC substrates each having an inner patterned surface, the DBC substrates being affixed on each side of the IGBT dies and the diode dies at the patterned inner surfaces to form a sandwich structure. A substrate attachment layer may be deposited on each of the outer surfaces of the DBC substrate, which is opposite the inner surfaces. Also included is a pair of heat exchangers, each of the heat exchangers affixed to a DBC outer surface substrate attachment layer. The heat exchangers may be made of aluminum or copper material and may have passages for carrying a coolant.

Some double sided cooled power modules have an insulated gate bipolar transistor (IGBT); a diode spaced apart from the IGBT; a pair of patterned metallic substrates each having an inner substrate surface, the patterned metallic substrates being affixed on each side of the IGBT and the diode at the inner surfaces to form a sandwich structure. Also included is an insulation bond layer on each of an opposite, outer surface of the patterned metallic substrates, and a pair of heat exchangers, each of the heat exchangers being affixed to an insulation bond layer. The heat exchangers may be made of aluminum or copper material and may have passages for carrying a coolant.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

A power module packaging structure and process technology achieving comprehensive improvements in technical performance, in some systems, may realize a 200 A, 1200 V phase leg power module. These module level improvements in performance and manufacturability may contribute to reaching or exceeding targets for power electronics systems.

A power module packaging structure for liquid cooled automotive power modules may include power semiconductor switches positioned between two symmetric planar substrates, which may serve to form electrical interconnections and insulation functions. Two mini coolers may be directly bonded to the outside of these substrates. The power switches, in a phase leg electrical topology, may include semiconductor device dies which are orientated in an upward facing and/or downward facing configuration. Bonding areas between semiconductor device dies and substrates and bonding areas between substrates and coolers may utilize nearly identical or similar materials and may be formed in one heating process. A special fixture may be used to enable a highly efficient, inexpensive and repeatable production process. The bonding structure and/or materials are also disclosed.

Figure 1:
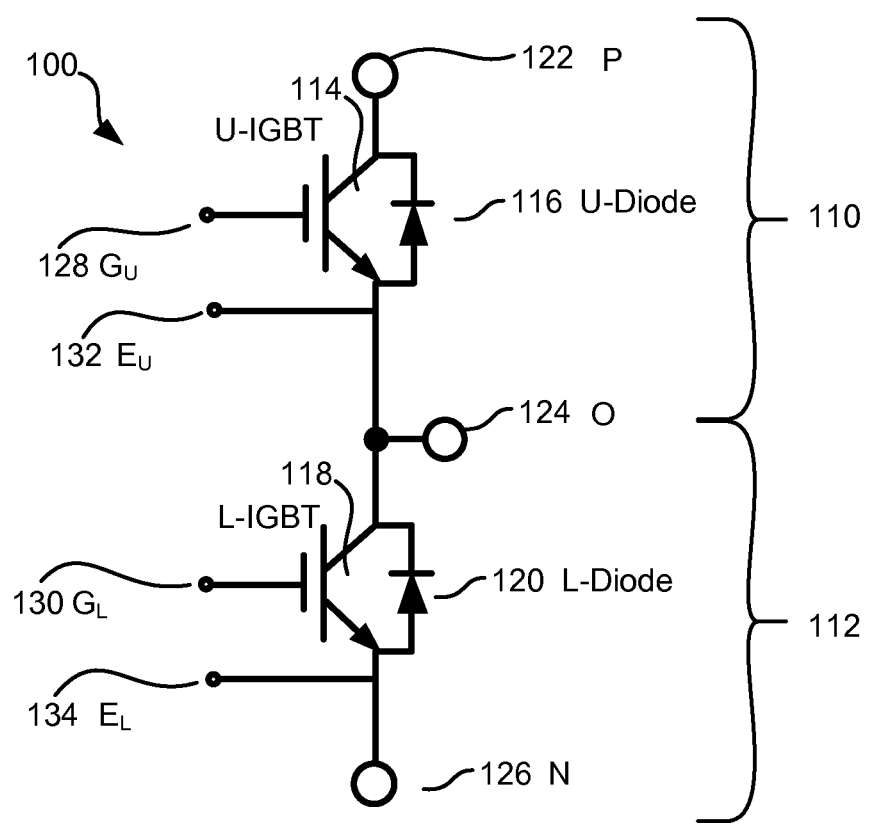
FIG. 1 is a diagram of a single phase leg circuit configuration.

FIG. 1 is a single phase leg circuit configuration 100 which may include at least two power switch units 110 and 112. The power switch unit 110 may include an insulated gate bipolar transistor (IGBT) or metal-oxide semiconductor field-effect transistor (MOSFET) 114. The power switch unit 110 may include a diode 116 which may be spaced apart from the IGBT or MOSFET 114. All of the switches may be made of Si, SiC, or GaN. Similarly, the power switch unit 112 may include an IGBT or MOSFET 118 and a diode 120 which may be spaced apart from the IGBT or MOSFET 118. The power switch unit 110 may be referred to as an upper power switch unit and the power switch unit 112 may be referred to as a lower power switch unit.

The single phase leg circuit configuration 100 may include three high power leads, for example, a positive lead 122, a neutral lead 124 and a negative lead 126. Also, the single phase leg circuit configuration 100 may include four control signal leads. For example, the upper power switch unit 110 may include an upper gate lead 128 and an upper emitter lead 132. The power lower switch unit 112 may include a lower gate lead 130 and a lower emitter lead 134. The single phase leg circuit 100 may be implemented in one or more power semiconductor switch dies. In operation, the single phase leg circuit configuration 100 may be operable to handle 200 A and 1200V, for example.

Figure 2:
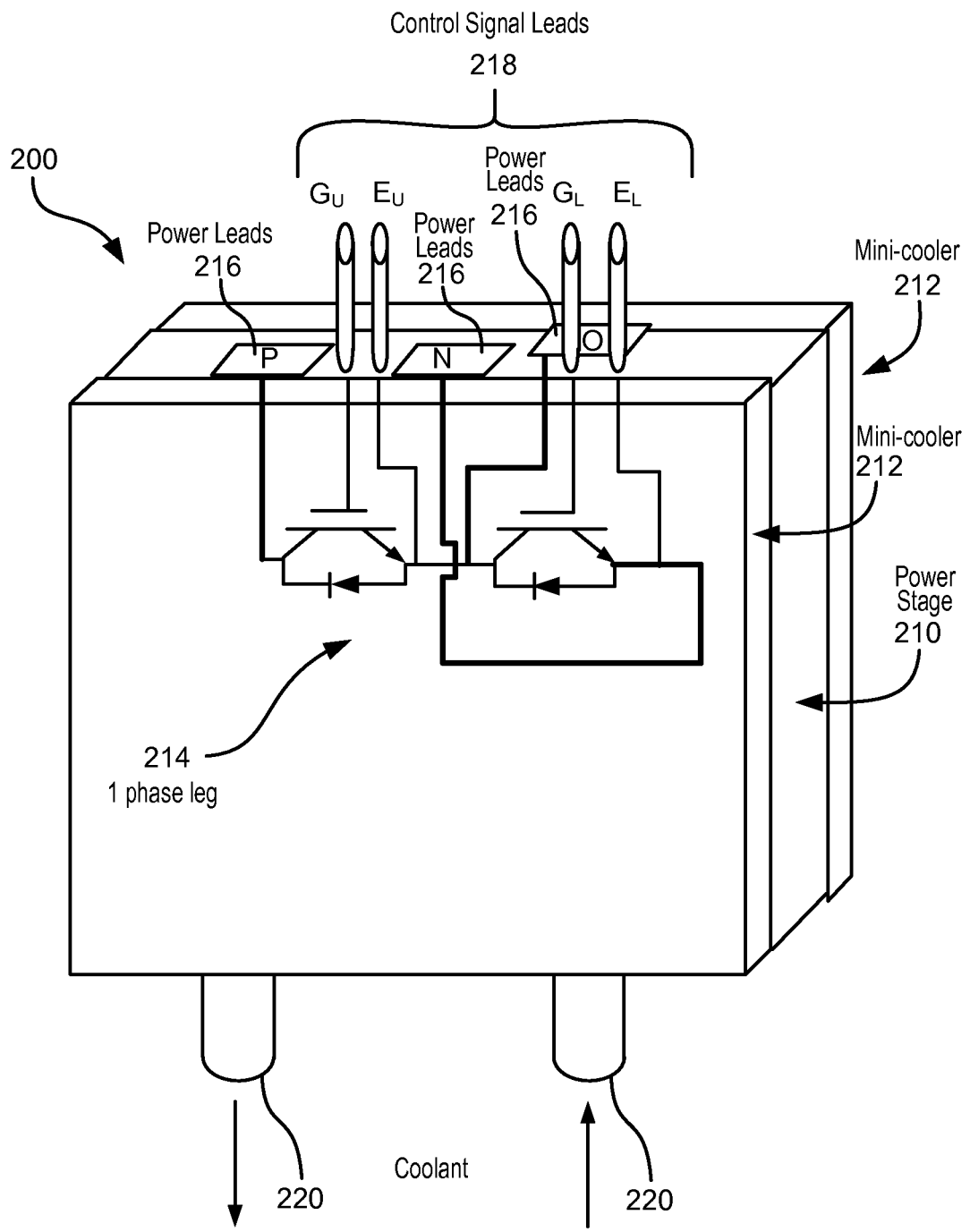
FIG. 2 is a block diagram of an exemplary power module with double sided planar bond interconnection and integrated heat exchangers.

FIG. 2 is a block diagram of an exemplary power module with double sided planar interconnections and integrated heat exchangers. A power module packaging structure 200 may include a planar power stage 210 attached to two mini coolers 212. The mini coolers 212 may be directly bonded to the planar power stage 210, for example, by soldering or sintering the mini coolers 212 directly to the power stage 210. The mini coolers 212 may be referred to as heat exchangers and/or heat sinks. The planar power stage 210 may include at least two power switch units 214. The two power switch units 214 may form a one phase leg configuration and may be similar or substantially the same as the two power switch units 110 and 112 shown in FIG. 1. Multiple phase leg power module packages 200 may be combined in parallel, for example, either to form a three phase leg configuration or to increase the power capability. The power module packaging structure 200 may be utilized as a building block for various electric power converters and/or power inverters.

The power module package 200 may include two integrated mini coolers 212. The planar power stage 210 may be directly bonded by a soldered or sintered attachment layer on each planar side to the mini coolers 212 in a planar sandwich formation. The soldered or sintered attachment layer may reduce thermal resistivity relative to thermal interface material (TIM) attachments. The planar sandwich formation may enable double sided cooling of the power stage 210. The coolant tubes 220 may enable a forced liquid cooling loop for the module cooling process.

A set of power leads 216 may include negative, positive and neutral electrical connections for the two power switch units 214. Also, signal leads 218 provide connections for gates and emitters within the two power switch units 214. Since the power switch semiconductor dies may be orientated in a face-up and/or face-down orientation, the power leads and signal leads may be attached both on the face up side and on the face down side of the power switch semiconductor dies.

Figure 3:
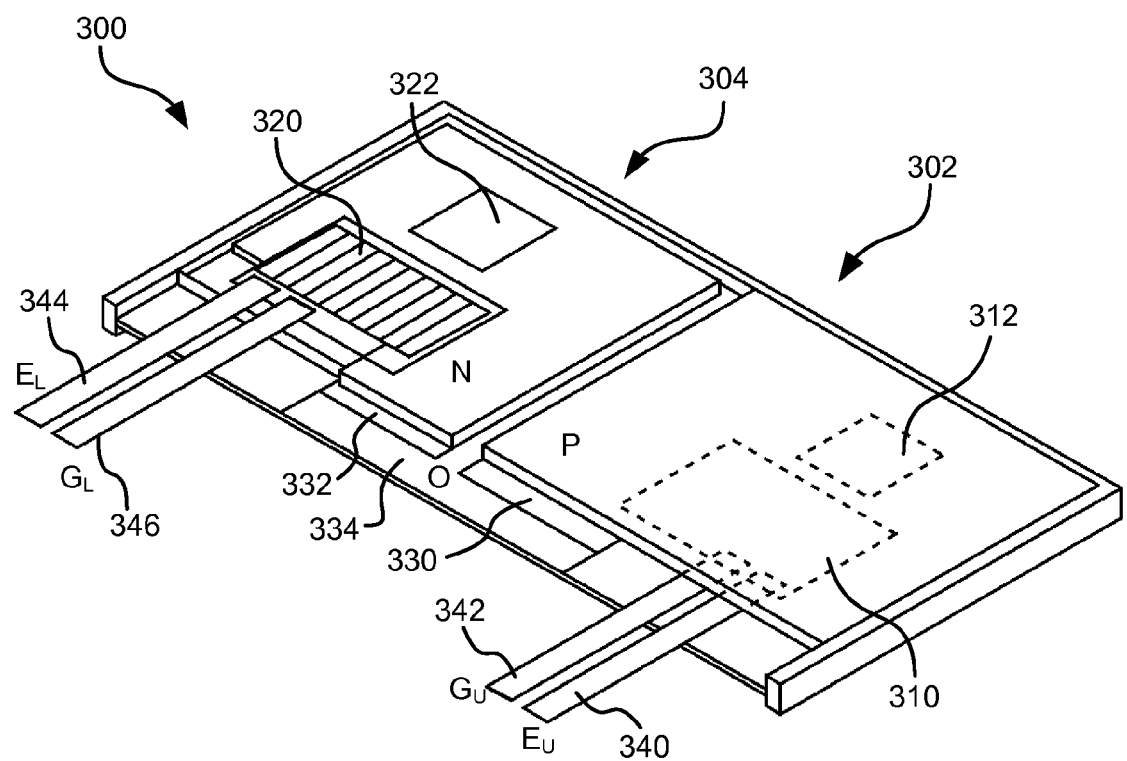
FIG. 3 is an exemplary diagram of an upper power switch and a folded lower power switch pair interconnection arranged in a face-up and face-down configuration rather than a face-up and face-up configuration.

FIG. 3 is power stage 300 comprising an upper power switch and a folded lower power switch pair interconnection arranged in a face-up and face-down configuration rather than a face-up and face-up configuration. In FIG. 3, an upper power switch 302 and a lower power switch 304 pair may be positioned on a plane in a face-up and face down orientation relative to a vertical semiconductor structure. Electrical interconnections between the switch dies may be achieved by bonding the switch dies to two (top and bottom) copper (Cu) substrates (shown in FIG. 4), which may be patterned to match with a pad layout on the semiconductor dies. This top and bottom layout of electrodes provides for the main power flow loop to be situated in the vertical X-Z plane (substantially normal to the die surface) rather than the typical horizontal X-Y plane, in which the side by side semiconductor dies lie. This results in a dramatically reduced enclosed loop area since the thickness of a switch die is in the range 0.1 mm, compared to its length and width of approximately 10 mm. This reduction in the enclosed area of the main power loop enables a significant reduction in electrical parasitic inductance. Also, electrical resistance may be reduced in the main power loop because of larger bond areas and Cu conduction traces, relative to aluminum (Al) bonded wire configurations, for example. In some systems, none of the power switch interconnections utilize wire bonding connections and all the external die interconnections are through the bonded planar substrate material, power leads and signal leads. The upper power switch 302 and the lower power switch 304 may be similar or substantially the same as the two power switch units 214 and/or the two power switch units 110 and 112.

The power stage 300 may include a plurality of power stage dies having two IGBT switch dies 310 and 320 and two diode dies 312 and 322 arranged in a folded face-up and face-down planar configuration. The switch dies 310, 312, 320 and 322 may be similar or substantially the same as the switch dies 410, 411, 412 and 413 shown in FIG. 4. Due to the face-up and face-down planar orientations of the power stage dies, the power leads and signal leads may be attached to the top and bottom sides of the power stage dies in a parallel planar configuration. For example, in some systems an upper power switch unit emitter lead 340, an upper power switch gate lead 342, a neutral power lead 334 may be attached to a bottom side of the power stage dies while a lower power switch unit emitter lead 344, a lower power switch gate lead 346, a positive power lead 330 and a negative power lead 332 may be attached to a top side of the power stage dies. The power and signal leads 330, 332, 334, 340, 342, 344 and 346 may be attached in the power stage 210 via the bond layers 436 and 438 as described with respect to FIGS. 4 and 5. The power stage dies 310, 320, 312 and 322 and the power and signal leads 330, 332, 334, 340, 342, 344 and 346 may be electrically interconnected in a planar bonded structure to the substrate 414 on top of the switch dies (shown in FIG. 4) and to the substrate 416 on the bottom of the switch dies (shown in FIG. 4), for example, by soldering and/or sintering.

Figure 4:
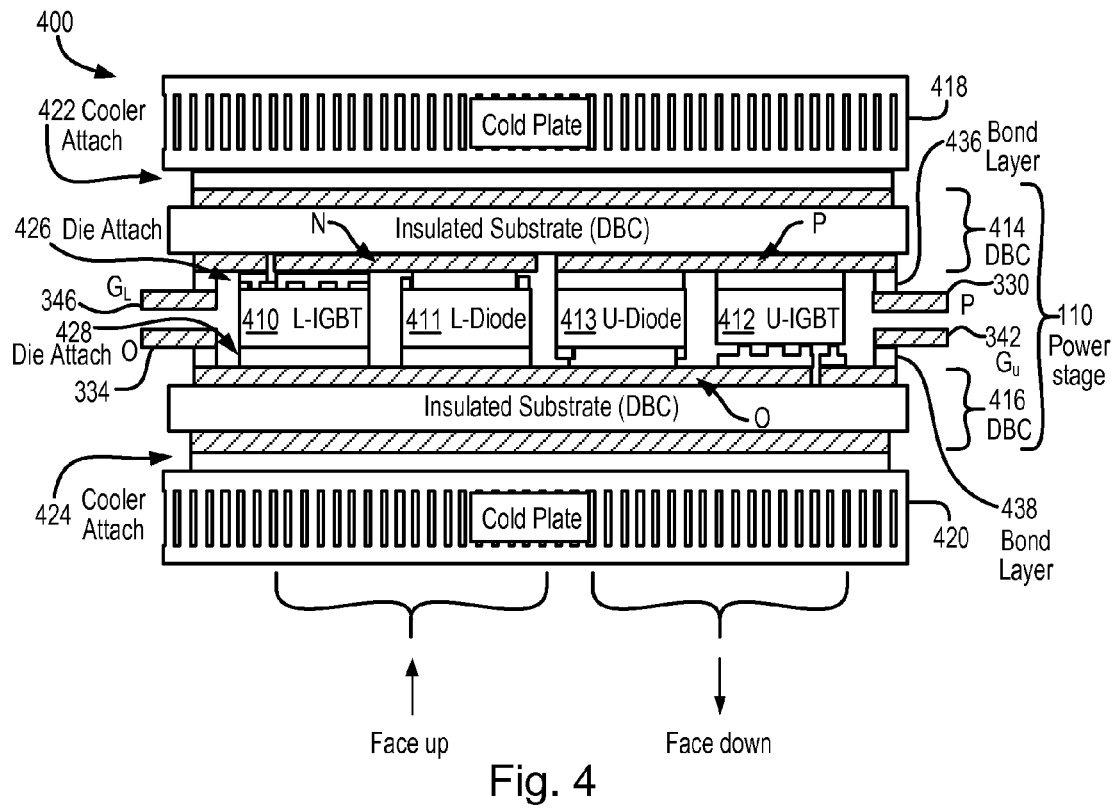
FIG. 4 is a cross sectional diagram of an exemplary power module packaging structure which may utilize top and bottom direct bonded copper substrates.

FIG. 4 is a cross sectional view of an exemplary power module packaging structure 400 which may utilize top and bottom direct bonded copper (DBC) substrates for interconnections. The power module packaging structure 400 may be similar or substantially the same as the power module packaging structure 100. For example, the power module packaging structure 400 may include the power stage 210 and two mini coolers 418 and 420 which may be directly bonded to the power stage 210 by soldering or sintering. The power stage 210 may include two or more power switch units, each having an IGBT or MOSFET semiconductor die and a diode semiconductor die which is separate from the IGBT or MOSFET as described with respect to FIGS. 1, 2 and 3. The two or more power switch units may be implemented as a lower switch IGBT die 410 and lower switch diode die 411 and an upper switch IGBT die 412 and upper switch diode die 412 shown in the cross sectional diagram of FIG. 4. Also shown in the cross sectional view of FIG. 4 are the lower gate lead 346, the neutral lead 334, the positive lead 330 and the upper gate lead 342. The lower emitter 344, upper emitter 340 and negative lead 332 are not visible in the cross section view of FIG. 4. The two power switch units shown in FIG. 4 may be similar to or substantially the same as the upper power switch unit 302 and the lower power switch unit 304 pair arranged physically in a face-up and face down configuration. The semiconductor switch dies 410, 411, 412 and 413 may be electrically interconnected in a planar structure by bonding the top of the switch dies to a patterned substrate 414 and the bottom of the switch dies to a patterned substrate 416, for example, by soldering and/or sintering to the top and bottom substrates 414 and 416. The surfaces of the top and bottom substrates 414 and 416 which face the switch dies may be patterned to align with a layout of pads on the top and bottom surfaces of the switch dies 410, 411, 412 and 413. The substrates 414 and/or 416 may include direct bond copper (DBC) substrates which may include electrical insulation in a ceramic slice, sandwiched inside of bonded copper material that may provide electrical and/or thermal conduction. Alternatively, the substrates 414 and/or 416 may include direct bond aluminum (DBA) or another metal element in place of the copper. The upper power switch dies 412 and 413 and the lower power switch dies 410 and 411 may be arranged in a face-up and face down configuration and electrode terminals or leads may be arranged on or near both the top and bottoms surfaces of the switch dies. For example, in some systems, a negative power lead and a lower emitter signal lead may be attached to the top side of the face up, lower power switch unit, semiconductor dies 410 and 411. A positive power lead may be attached to the top side of a face-down, upper power switch unit semiconductor dies 412 and 413. A neutral power lead and upper emitter signal lead may be attached to the bottom side of the face up, lower power switch unit semiconductor dies 410 and 411 and to the bottom side of the face down, upper power switch unit semiconductor dies 412 and 413. In some systems, a lower power switch unit gate lead may be attached to the top side of the face up, lower power switch unit semiconductor dies 410 and 411 and an upper switch unit gate lead may be attached to the bottom side of the face down, upper power switch unit of the semiconductor dies 412 and 413.

Bonding layers, for example, the die attach bonds 426 and/or 428 between the semiconductor dies 410, 411, 412 and 413 and the substrates 414 and 416, bond layers 436 and 438 between the signal and power leads 330, 332, 334, 340, 342, 344 and 346 and the substrates 414 and 416 and, the substrate attach bonds 422 and 424 between the substrates 414 and 416 and the mini coolers 418 and 420 may be made by planar bonding materials and associated processing in a bonding scheme. Exemplary bonding schemes may include solders and soldering, silver (Ag) and sintering, as well as solid and/or liquid diffusion bonding. In some systems, all the bond layers in the power module packaging structure 400 may utilize the same bonding scheme of material and/or processing for a simplified manufacturing process. Top metallization on the semiconductor switch dies 410 and 412 may be different from what would be utilized in dies which are interconnected via aluminum (Al) bonding wires. For example, a wafer level special metallization may include silver (Ag), gold (Au) and/or nickel (Ni) finishing.

This planar bond structure of the switch dies 410, 411, 412 and 413 may expose top substrate surfaces as extra thermal paths to the directly bonded integrated mini coolers 418 and 420. In this manner, heat removal from hot power switches may be significantly improved by double sided cooling, for example, with a forced liquid cooling technique. An extra top cooling surface relative to wire bonded semiconductor dies, adds a large heat transfer path and the use of direct bonding instead of stacking through base plate and thermal interface material (TIM) also reduces the thermal resistance in each thermal path to provide improved cooling of the power stage 210.

Figure 5:
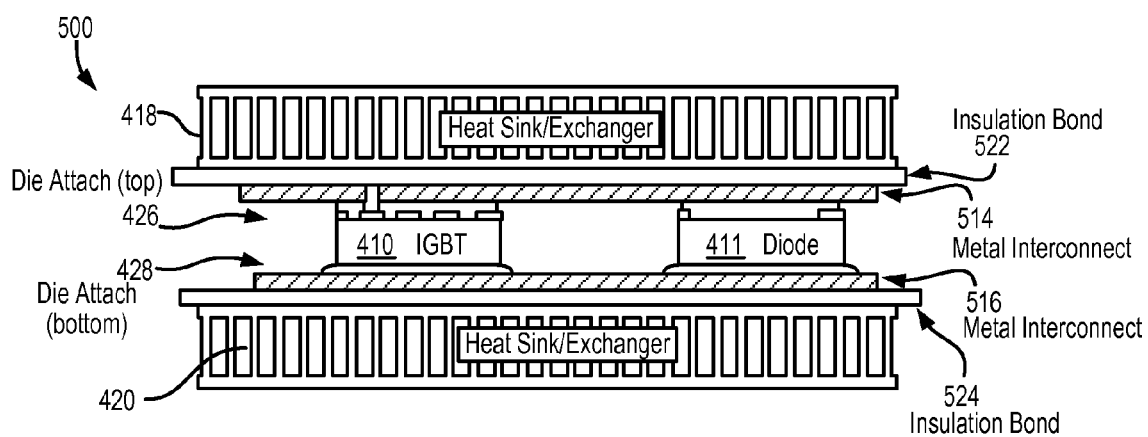
FIG. 5 is a cross sectional diagram of an exemplary power module packaging structure which comprises insulated metal frame bonds.

FIG. 5 is a cross sectional view of an exemplary power module packaging structure 500 which may include insulated metal frames rather than DBC substrates. The power module packaging structure 500 may be similar or substantially the same as the power module packaging structure 400 except that insulated metal frames 514, 516 may replace the direct bonded copper substrates 414 and/or 416. In this regard, metal interconnects 514 and/or 516 may be patterned to align with a layout of pads on the switch dies 410, 411, 412 and 413 (only 410 and 412 are shown in FIG. 5). Die attach bonds 426 and/or 428 between the semiconductor dies 410 and 412 and the metal interconnects 514 and 516 respectively and bond layers 436 and 438 between the signal and power leads 330, 332, 334, 340, 342, 344 and 346 and the metal interconnects 514 and 516, may be made by planar bonding materials and associated processing in a bonding scheme as described with respect to FIG. 4. The metal interconnects 514 and 516 may include copper and Molybdenum or alloys of copper and other metals, and may be bonded to the mini coolers 418 and 420, respectively, via insulation bonds 522 and 524. The insulation bonds may include polymer resins and a curing process, for example.

FIGS. 6 through 9 illustrate an exemplary two-step assembly and heating process and corresponding technology for manufacturing the planar power stage 210 described with respect to FIGS. 1, 2, 3, 4 and 5. This packaging process technology may be referred to as a planar-bond-all process which designates that the semiconductor switch dies 310, 312, 320 and 322, and the power leads and signal leads 330, 332, 334, 340, 342, 344 and 346, for example, are double sided planar bonded to the planar substrates 414 and 416, for example, to form a single, permanently bonded unit. The machined shims 614, which may be made of copper or copper alloys with a coefficient of thermal expansion (CTE) closer to silicon's, such as Cu/Mo or Cu/W, may be bonded between the semiconductor switch dies 310, 312, 320, 322 and the substrates 414 and 416. To simplify the process, each power lead in 616 may be machined as one piece with one or more corresponding shims in 614. This planar bonded power stage unit is then bonded by solder or sintering to the planar surface of the mini coolers or heat exchangers 418 and 420 to form a single bonded power module packaging structure 200, 300, 400, 500 for example. The bonding areas between dies and substrates, between leads and substrates and/or between substrates and coolers may include identical materials and may be formed in one heating process. One or more fixtures may be utilized to enable highly efficient and/or batch production of the planar power module packages.

Figure 6:
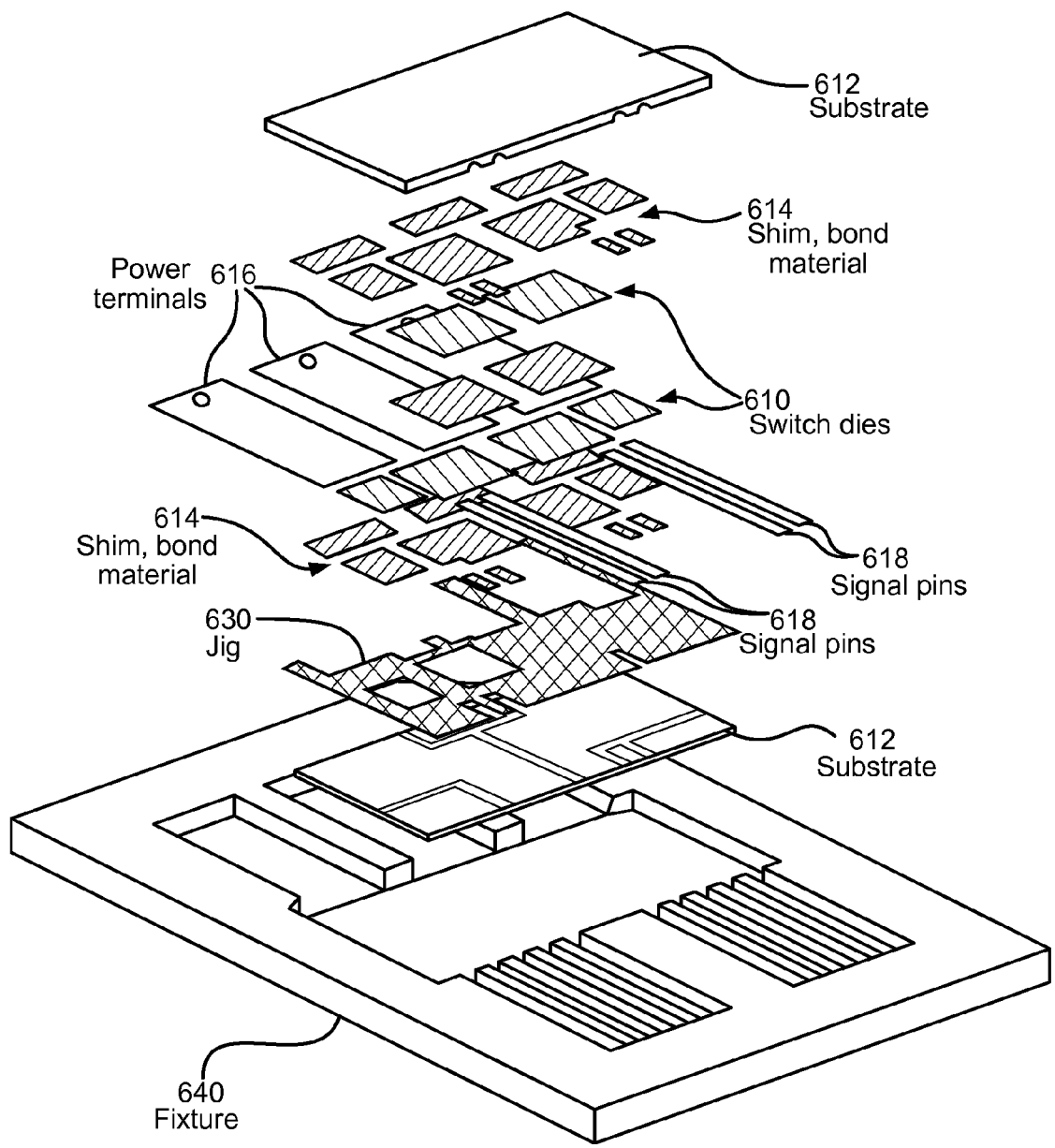
FIG. 6 is a diagram of an exemplary assembly step for manufacturing a planar power stage structure.

FIG. 6 is a diagram of an exemplary assembly step for manufacturing the planar power stage structure 210. The power stage 210 components may be prepared for assembly by using a jig 630 and a fixture 640. The jig 630 scheme may include a machined polyimide frame which may withstand high temperatures up to over 250° C. The jig 630 and fixture 640 scheme may include machined copper (Cu) or other high thermal conductive metals. The jig 630 may be utilized for positioning the power stage 210 components between the two substrates 414 and 416, for proper alignment of the semiconductor switch dies 410, 411, 412 and 413, for example. The fixture 640 may hold the other components in proper alignment so that the components maintain a correct positional relationship during assembly and heating. In some systems, the jig 630 may stay within the power module packaging structure for the life of the product and may contribute to conduction and/or insulation within the final product of the power stage 210. In some systems, the fixture 640 may be removed and/or re-used.

The power stage 210 components may include, for example, semiconductor switch dies 610, patterned substrate 612, bonding material such as pre-form solder or printed paste, shims 614, power leads or terminals 616 such as positive, negative and neutral leads and signal leads 618, for example, upper emitter, upper gate, lower emitter, lower gate and jig 630. The power stage 210 components may be assembled in the fixture 640 in preparation for the heating step.

Figure 7:
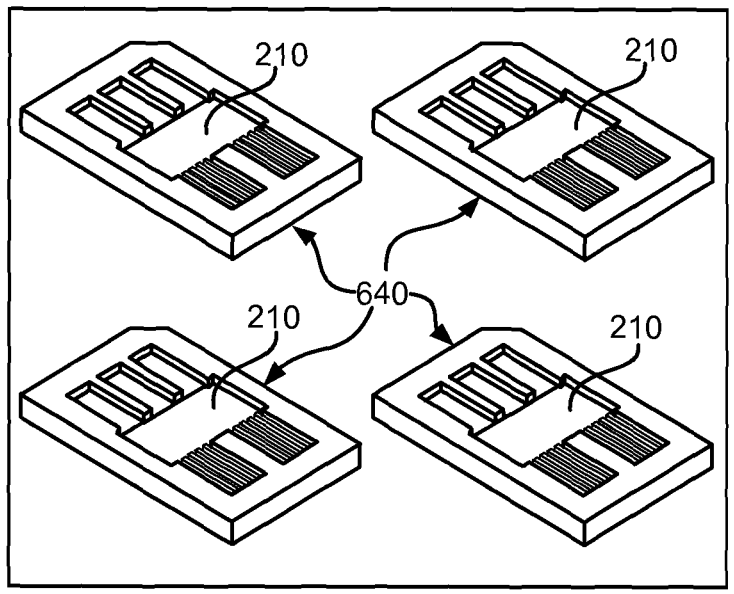
FIG. 7 is an illustration of exemplary multiple power stage assemblies heating in an oven to accomplish a bonding process.

FIG. 7 is an exemplary illustration of multiple power stage 210 assemblies heating in an oven. One or more power stage 210 assemblies which may include the jig 630 may be placed into a fixture 640 and into an oven for processing which may include heating and cooling cycles for soldering and/or sintering component interconnection bonds within the power stage 210 assemblies. Four instances of the power stage 210 are shown in four fixtures 640, being heated to create interconnection bonds between the assembled components in a batch process. However, the system is not limited in this regard and any suitable number of power stage 210 assemblies may be manufactured concurrently. In some systems, after the heated and cooled power stage 210 units are removed from the fixtures 640, the fixtures 640 may be reused for another batch of power stage 210 products.

Figure 8:
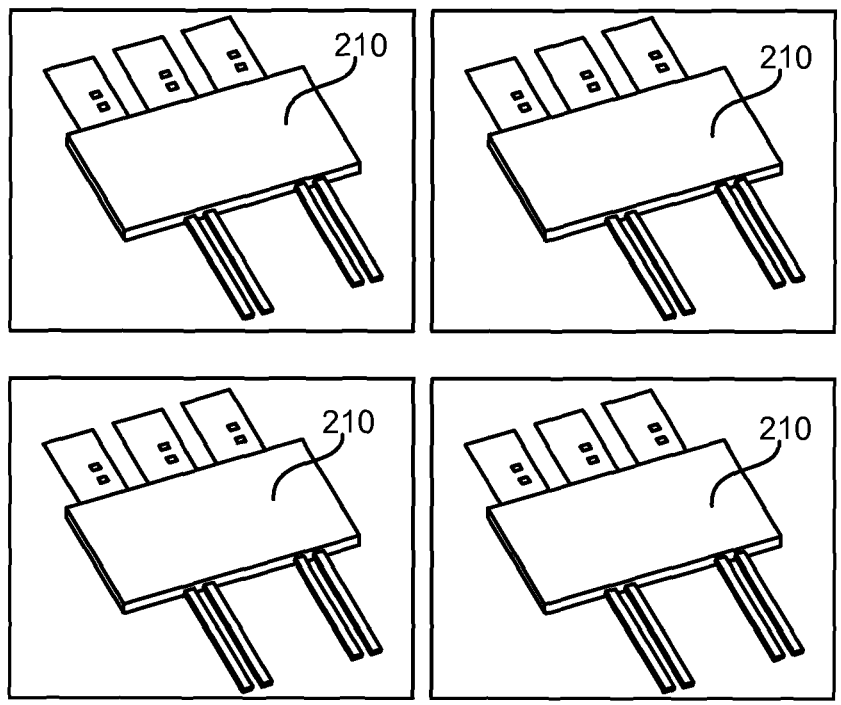
FIG. 8 shows exemplary multiple power stage units after completing an assembly and heating process with the power stage components planar bonded by soldering or sintering.

FIG. 8 is an exemplary representation of multiple power stage 210 units after the assembly and heating processes and the power stage components are bonded by soldering or sintering, for example, to form a single integrated power stage unit 210.

Figure 9:
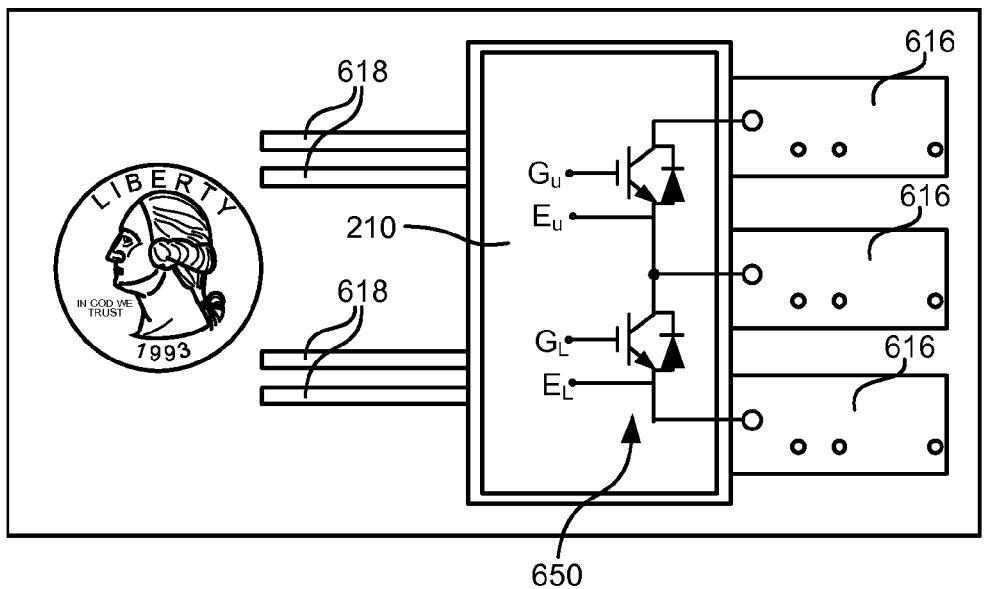
FIG. 9 is an electrical interconnection schematic within a bonded power stage unit.

FIG. 9 is an exemplary illustration of an electrical interconnection schematic 650 within the bonded power stage unit 210. The electrical interconnection schematic 650 may be bonded to the positive, negative and neutral power leads 616 and the upper emitter, upper gate, lower emitter and lower gate signal leads 618.

Once the power stage unit 210 is assembled and bonded by heating, the power stage unit may be protected by molding or encapsulation.

Figure 10:
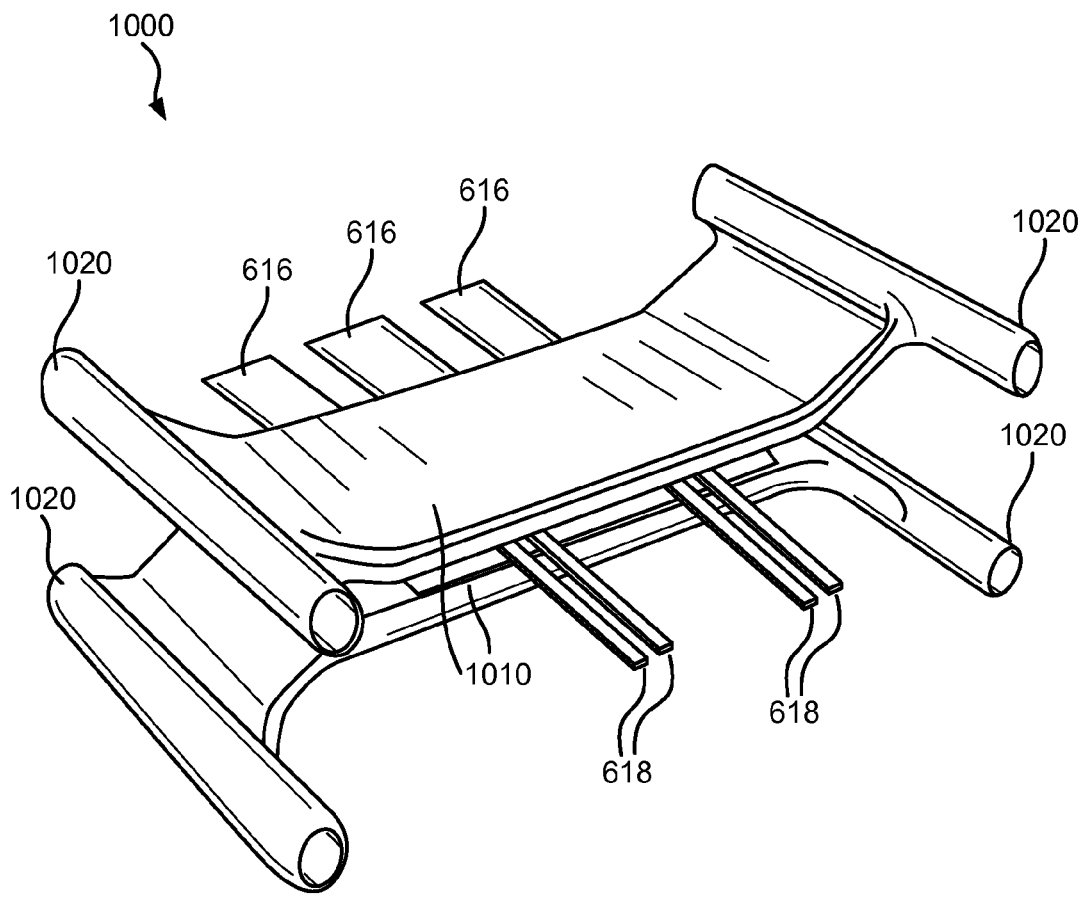
FIG. 10 is a prototype of a power module packaging structure with integrated double sided mini-coolers (exchangers).

FIG. 10 is an exemplary representation of a prototype power module packaging structure 1000 which may be similar or substantially the same as the power module packaging structures 200, 300, 400 or 500 described with respect to FIGS. 1-9. The power module packaging structure 1000 may include two mini-coolers 1010 directly bonded, for example, to the power stage 210. The two mini coolers 1010 may be similar or substantially the same as the mini coolers or heat exchangers 418 and/or 420, for example. The substrates 414 and/or 416 of the planar bonded power stage unit 210 may be bonded, for example, by solder or sintering, to planar surfaces of the mini coolers or heat exchangers 418 and 420 respectively, to form the bonded power module packaging structure 1000. The power leads 616 and signal leads 618 are also shown extending from the power module packaging structure 1000. The power module packaging structure 1000 may be encapsulated in molding (not shown here). For example, a silicone gel may be introduced into open cavities in the power stage 210. Also, a molding compound may be utilized to encapsulate all or a portion of the power switch module. The encapsulation may provide openings and/or attachments for the power and signal leads as well as any liquid cooling tubes.

The power module package structure 200, 300, 400, 500 or 1000 may be connected to an electrical busbar and/or a cooling loop. Moreover, multiple power module package units may be connected onto a central laminated power bus bar which may be designed with a low inductance structure. The multiple power module packages may be connected in series or in parallel to form a designed electrical power conversion topology and/or power requirement. External cooling may be easily connected to the modules via the cooling tubes 1020.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A power module package comprising:
a first insulated gate bipolar transistor (IGBT) semiconductor die and a first diode semiconductor die spaced apart from said first IGBT semiconductor die, wherein said first IGBT semiconductor die and said first diode semiconductor die form a first planar power switch unit;

a second IGBT semiconductor die and a second diode semiconductor die spaced apart from said second IGBT semiconductor die, wherein said second IGBT semiconductor die and said second diode semiconductor die form a second planar power switch unit, wherein said first planar power switch unit and said second planar power switch unit are arranged in a plane of a planar power stage and comprise a one phase leg configuration and said first planar power switch unit is oriented in a face-up configuration relative to said plane of said planar power stage and said second planar power switch unit is oriented in a face-down configuration relative to said plane of said planar power stage;

a pair of direct bonded copper (DBC) substrates each having a patterned inner surface wherein a first of said pair of DBC substrates is directly bonded to a top side and a second of said pair of DBC substrates is directly bonded to a bottom side of said planar power stage comprising said one phase leg configuration of said first planar power switch unit and said second planar power switch unit to form a sandwich structure, and wherein said patterned inner surface of each of said pair of DBC substrates is attached and aligned with semiconductor die pads of said first planar power switch unit and said second planar power switch unit;

a substrate attachment layer on an outer surface of each of said pair of DBC substrates, said outer surfaces being opposite said patterned inner surface of each of said pair of DBC substrates; and each of two heat exchangers being directly bonded to said outer surface of each of said pair of DBC substrates by each of said substrate attachment layers.

2. The power module package of claim 1, wherein said direct bonds are formed by soldering, sintering, solid diffusion bonding or liquid diffusion bonding.

3. The power module package of claim 1, wherein said heat exchangers are made of aluminum or copper material.

4. The power module package of claim 1, wherein said heat exchangers have passages for carrying a coolant.

5. The power module package of claim 1, wherein semiconductor die pads are located on the top side of said planar power stage comprising said one phase leg configuration and on the bottom side of said planar power stage comprising said one phase leg configuration.

6. The power module package of claim 5, wherein power leads and signal leads for external connections are soldered or sintered to said top side and said bottom side located semiconductor die pads of said planar power stage comprising said one phase leg configuration.

7. The power module package of claim 1, wherein a first power lead and a first emitter signal lead are attached to a top of said face up first power switch unit and a second power lead is attached to a top of said face-down second power switch unit and a third power lead and a second emitter lead are attached to a bottom of said face up first power switch unit and to a bottom of said face down second power switch unit.

8. A power module package comprising:

a first insulated gate bipolar transistor (IGBT) semiconductor die and a first diode semiconductor die spaced apart from said first IGBT semiconductor die, wherein said first IGBT semiconductor die and said first diode semiconductor die form a first planar power switch unit;

a second IGBT semiconductor die and a second diode semiconductor die spaced apart from said second IGBT semiconductor die, wherein said second IGBT semiconductor die and said second diode semiconductor die form a second planar power switch unit, wherein said first planar power switch unit and said second planar power switch unit are arranged in a plane of a planar power stage and comprise a one phase leg configuration and said first planar power switch unit is oriented in a face-up configuration relative to said plane of said planar power stage and said second planar power switch unit is oriented in a face-down configuration relative to said plane of said planar power stage;

a pair of insulated metal frame substrates each having a patterned metallic inner surface wherein a first of said pair of insulated metal frame substrates is directly bonded to a top side and a second of said pair of insulated metal frame substrates is directly bonded to a bottom side of said planar power stage comprising said one phase leg configuration of said first planar power switch unit and said second planar power switch unit to form a sandwich structure, and wherein said patterned inner surface of each of said pair of insulated metal frame substrates is attached and aligned with semiconductor die pads of said first planar power switch unit and said second planar power switch unit;

a substrate attachment layer made of insulation bond, on an outer surface of each of said pair of insulated metal frame substrates, said outer surfaces being opposite said patterned inner surface of each of said pair of insulated metal frame substrates; and each of two heat exchangers being directly bonded to said outer surface of each of said pair of insulated metal frame substrates by said substrate attachment layers.

9. The power module package of claim 8, wherein said direct bonds which bond each of said pair of insulated metal frame substrates to said planar power stage comprising said one phase leg configuration are formed by soldering, sintering, solid diffusion bonding or liquid diffusion bonding.

10. The power module package of claim 8, wherein a first power lead and a first emitter signal lead are attached to a top of said face up first power switch unit and a second power lead is attached to a top of said face-down second power switch unit and a third power lead and a second emitter lead is attached to a bottom of said face up first power switch unit and to a bottom of said face down second power switch unit.

* * * * *